United States Patent [19]

Flassayer et al.

[11] Patent Number: 4,525,238

[45] Date of Patent: Jun. 25, 1985

[54] PROCESS FOR MANUFACTURING AN ELECTRIC CIRCUIT INTENDED FOR FIRING A PYROTECHNIC DEVICE AND THE CIRCUIT THUS OBTAINED

[75] Inventors: Claude Flassayer; Bernard Le Grives; Paul R. Simon, all of Nice, France

[73] Assignee: Sfernice Societe Francaise de l'Electro-Resistance, Paris, France

[21] Appl. No.: 559,464

[22] Filed: Dec. 8, 1983

[30] Foreign Application Priority Data

Dec. 15, 1982 [FR] France .............................. 82 21024

[51] Int. Cl.³ ......................................... H01L 21/306
[52] U.S. Cl. .................................... 156/645; 29/620;
156/638; 219/543; 338/195; 338/308
[58] Field of Search ....................... 219/121 EM, 543;
338/195, 308, 309; 29/610 R, 620; 102/28 R;
361/248; 156/625, 627, 638, 645, 647

[56] References Cited

U.S. PATENT DOCUMENTS

| | | | |
|---|---|---|---|
| 3,682,096 | 8/1972 | Ludke et al. | 102/28 R |
| 4,053,977 | 10/1977 | Simon et al. | 29/620 |
| 4,075,452 | 2/1978 | Simon | 219/121 |
| 4,294,648 | 10/1981 | Brede et al. | 156/627 |

FOREIGN PATENT DOCUMENTS 2013677  4/1970  France .
1600106  7/1970  France .
1231694  5/1971  United Kingdom .

*Primary Examiner*—Volodymyr Y. Mayewsky
*Attorney, Agent, or Firm*—Lane, Aitken & Kananen

[57] ABSTRACT

The process is for manufacturing an electric circuit which comprises an electric element for firing a pyrotechnic device, in which a sheet (1) made from an electrically resistant material is fixed to an electrically insulating support (3), and in which two conducting zones (12a, 12b) separated by an electrically resistant element (13) are then etched on this sheet.

This process comprises the following steps:
  a fine nickel layer and then a fine copper layer are applied to the sheet (1), after which;
  a hole (7) is pierced through the assembly,
  a fine copper layer is deposited on the assembly, a protecting mask is deposited in the openings etched in the resistive sheet, a copper layer (10) then a tin-lead layer are deposited in the hole (7) and on both faces of the assembly,
  the protecting mask is removed and the fine copper layer which was protected by the mask is stripped by chemical action and,
  the external tin-lead layer is removed by chemical action.

The invention applies more especially to improving the reliability and safety of firing an electric munition firing device.

4 Claims, 13 Drawing Figures

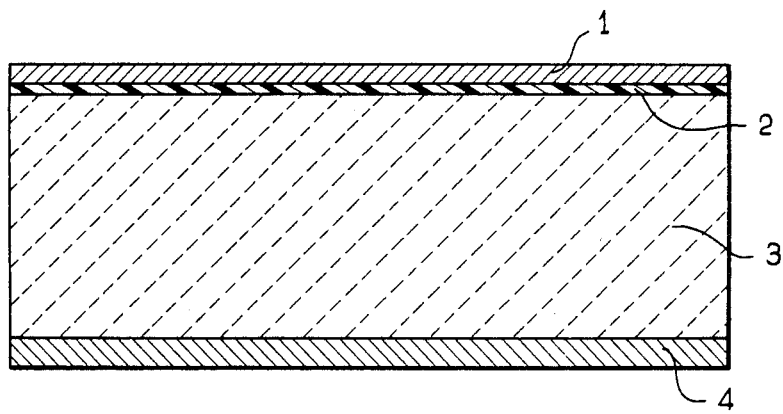
FIG_1
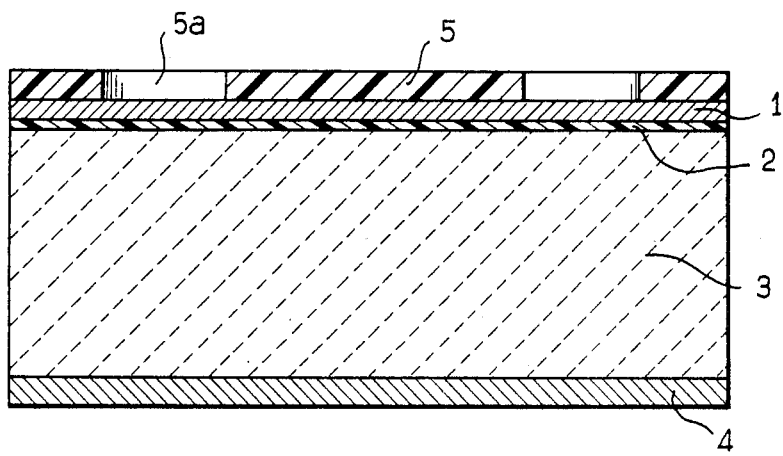
FIG_2
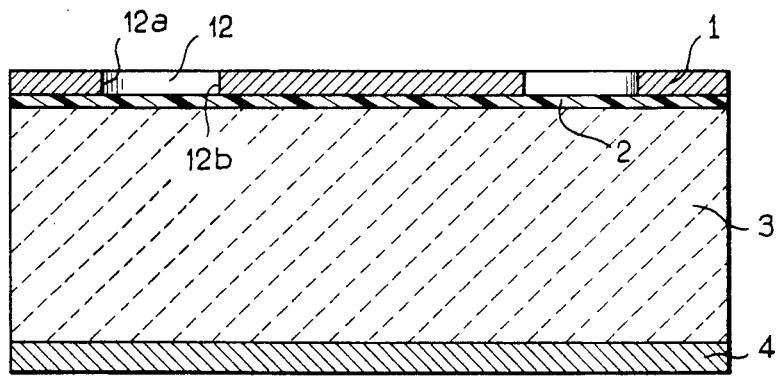
FIG_3

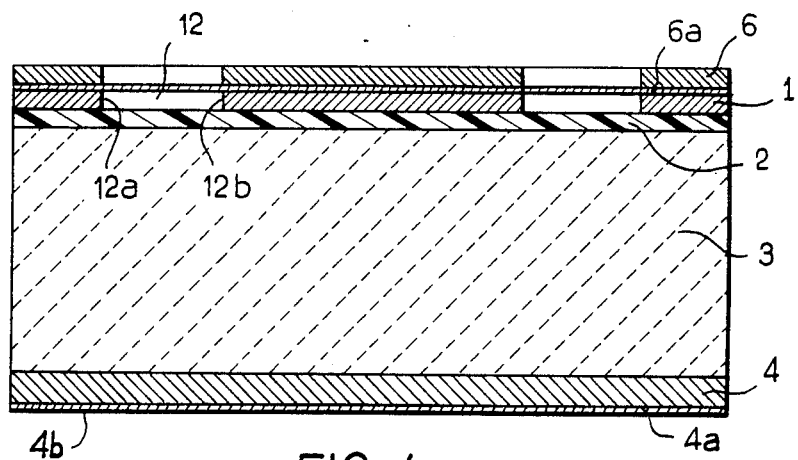
FIG_4
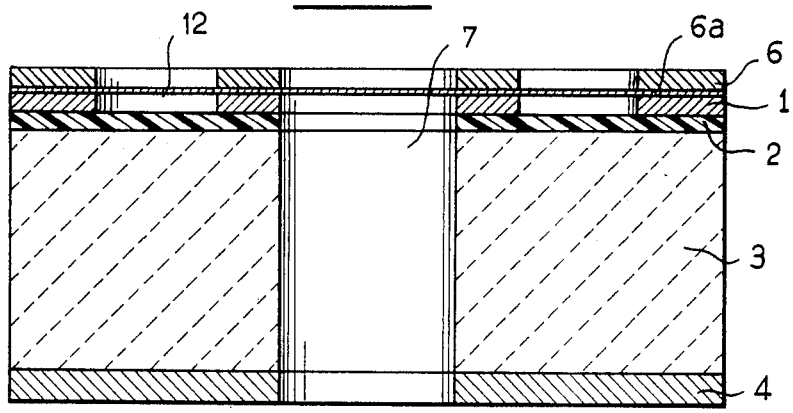
FIG_5
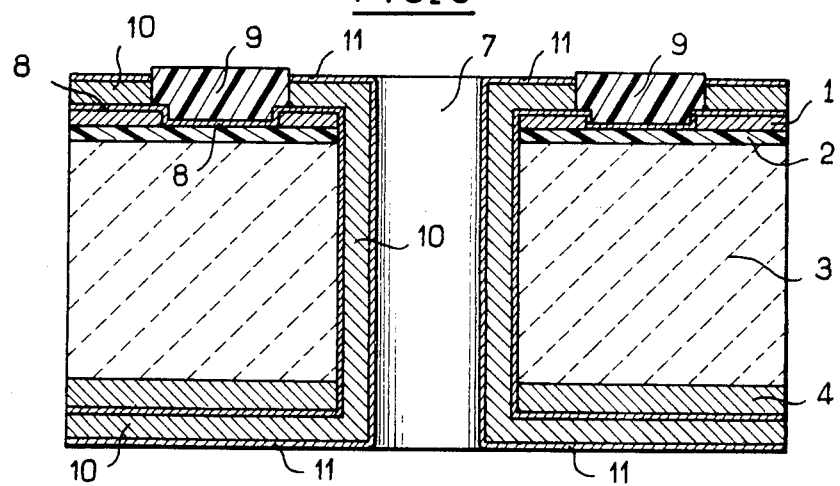
FIG_6

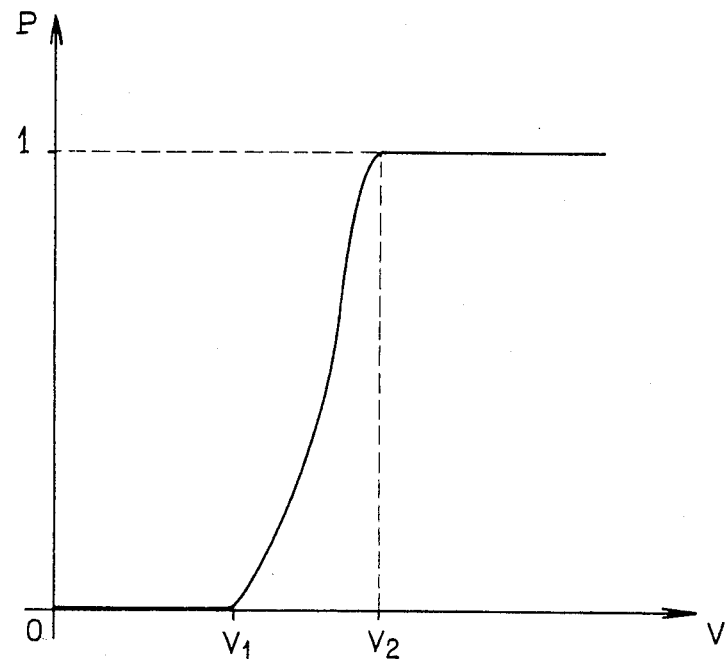
FIG_9
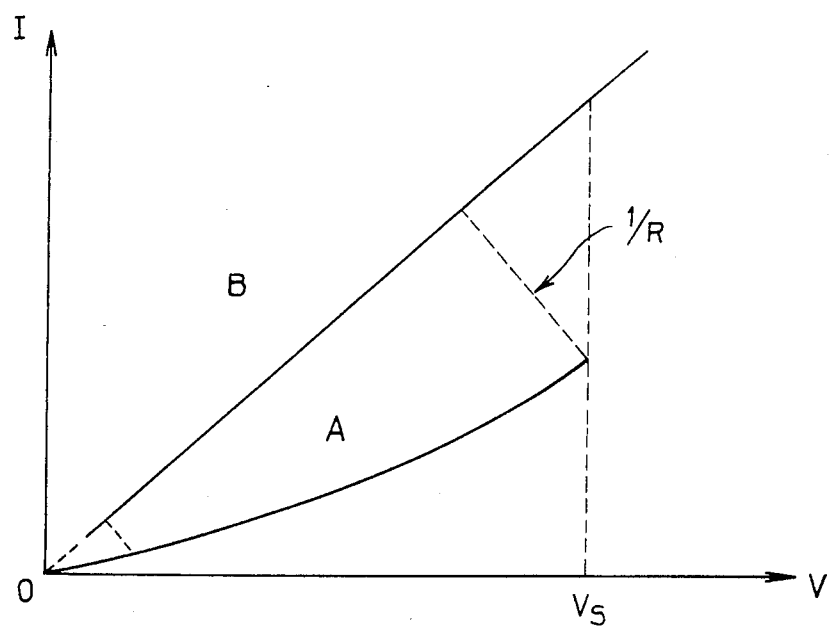
FIG_13

PROCESS FOR MANUFACTURING AN ELECTRIC CIRCUIT INTENDED FOR FIRING A PYROTECHNIC DEVICE AND THE CIRCUIT THUS OBTAINED

BACKGROUND OF THE INVENTION

1. Field of the Invention

The present invention relates to a process for manufacturing a small-sized electric circuit for firing a pyrotechnical device.

The invention also relates to the electric circuit obtained more especially by the above-mentioned process.

2. Description of the Prior Art

Known electric firing devices comprise an electric circuit which comprises an electrically resistant element which heats or is melted under the effect of the passage of an electric current applied to the terminus of the circuit so as to cause deflagration of the explosive which is in contact with this resistant element.

Such devices are used more especially for firing munitions used in weapons with tubes such as rapid firing guns (3,000 shots per minute or more).

In these firing devices, the electric circuit is formed by a miniaturized printed circuit comprising a very fine electrically resistant wire having a diameter equal to about ten microns which is soldered to this printed circuit.

Soldering of this electrically resistant wire to the printed circuit is a very delicate and costly operation.

In addition, the circuits thus formed are relatively unreliable. In fact, in such a circuit, the probability of firing must be zero below a given electric voltage applied to the filament and must be equal to unity in a well defined time for a voltage greater than the above mentioned value. It can be readily understood that, if there exists the slightest soldering defect of the filament and if the defect has dimensions or a section deviating however little from the optimum values, the firing may be obtained in some cases at a much lower voltage and in other cases at a voltage higher than the desired optimum value.

From the French Pat. No. 2,013,677 a process is known for manufacturing an electric circuit comprising an electrically resistant element for firing a pyrotechnic device. This process comprises the steps in which a sheet of electrically resistant material is fixed to an electrically insulating support, two conducting zones separated by an electrically resistant element are etched on this sheet and each of these two conducting zones is covered at least partially by a layer of a conducting material providing electrical contact with the terminals feeding the electric current to the circuit.

This document provides no precise details of how to obtain reliable operation of the circuit obtained.

The aim of the present invention is to overcome the disadvantages of known electric circuits by proposing a process for manufacturing a circuit for firing a pyrotechnic device which is both simple and economic to construct and allows a circuit to be obtained whose operation is much more reliable than in the case of known construction.

SUMMARY OF THE INVENTION

According to the invention, this process is characterized by the following steps:

on the sheet is applied a fine layer of nickel, then a fine layer of copper, after which:

a hole is pierced through the assembly, a fine copper layer is deposited on the assembly, a protecting mask is deposited in the opening etched in the resistive sheet. A layer of copper of a thickness between 20 and 40 microns is deposited in the hole and on both faces of the assembly, then a tin-lead layer of a thickness between 5 and 15 microns, the protecting mask is removed and the fine copper layer which was protected by the mask is removed by chemical action and, the external tin-lead layer is removed by chemical action.

Etching the electrically resistant sheet allows a filament to be obtained whose dimensions, connection with the two conducting zones and ohmic value are controlled with extreme accuracy.

The conducting material layers applied to both conducting zones allows an excellent electrical contact to be obtained with the current supply terminals.

The conditions for firing the device comprising a circuit thus formed are thus perfectly reproducible and reliable.

According to an advantageous embodiment of the process, for etching the sheet, the sheet is covered by a mask formed by photoetching and reproducing the contour of the conducting zones and of the filament to be etched on this sheet and the whole formed by the mask and the sheet is subjected to the action of an appropriate eroding agent so as to remove the the material of sheet opposite the zones of the sheet which are not covered by the mask.

Processes for etching an electrically resistant sheet, more especially for forming electric resistances, have been described in French patents number 2,344,940 and No. 2,354,617 in the name of the applicant. These processes allow extremely fine and accurate etchings to be obtained. The electrically resistant filament thus obtained has a predetermined ohmic value which is perfectly reproducible in large scale manufacture.

The invention also relates to an electric circuit comprising an electrically resistant element for firing a pyrotechnic device.

In accordance with the invention, this circuit comprises a sheet made from an electrically resistant material bonded to an electrically insulating support, this sheet comprising two conducting zones separated by an electrically resistant filament etched in said sheet, these two conducting zones being each covered by a layer of a conducting material for providing the electrical contact with the terminals supplying the electric current to the circuit.

In a preferred version of the invention, the circuit has the form of a disc, the two conducting zones etched in the sheet are concentric, the central conducting zone being pierced with a hole which passes through the insulating support. The inside of this hole, the face of the insulating support opposite the sheet and a part of the central conducting zone are covered by a continuous layer of a good electrically conducting material, and the external conducting zone is covered partially by a layer of a good electricity conducting material, separated from the above-mentioned layer.

This particular form of the circuit allows it to be readily adapted to a pyrotechnic device.

The conducting layers allow a perfect electric connection to be easily established with the terminals of the circuit.

The electrically resistant sheet may be made from a resistive metal or alloy and have a thickness between about 1 and 10 microns.

In a variant of the invention, the electrically resistant sheet has two sheet parts situated in the extension of each other between which is inserted an amorphous semi-conductor material, for example of the ZnTe type (zinc tellurium).

The insertion of this amorphous semi-conductor material allows the firing conditions of a pyrotechnic device provided with such material to be further improved.

Other features and advantages of the invention will appear from the following description.

BRIEF DESCRIPTION OF THE DRAWINGS

In the accompanying drawings given by way of non-limiting examples:

FIG. 1 is a sectional view showing the resistive sheet bonded to its insulating support and illustrating the first step of the process of the invention, FIG. 2 is a sectional view showing the mask applied to the sheet and illustrating the second step of the process, FIG. 3 is a sectional view showing the etched respective sheet and illustrating the third step of the process, FIG. 4 is a view illustrating the fourth step: application on the etched sheet of a nickel layer and of a copper layer, FIG. 5 is a view illustrating the fifth step: piercing a central hole through the assembly, FIG. 6 is a view showing the application of a thick copper layer, FIG. 9 is a curve showing the evolution of the firing probability as a function of the voltage applied to the terminals of the circuit of FIG. 8.

FIG. 13 is a curve showing the evolution of the intensity of the current as a function of the voltage, in the case of the variant shown in FIGS. 10 to 12.

DESCRIPTION OF THE PREFERRED EMBODIMENTS

Figure 7:
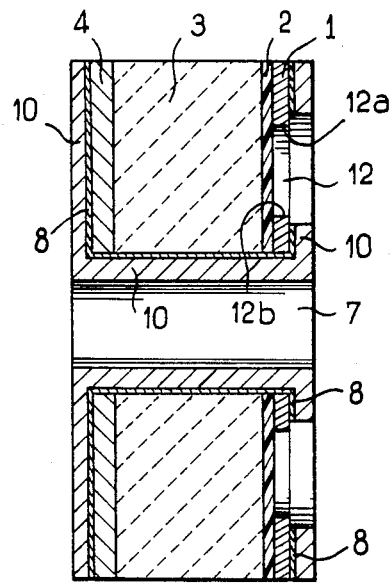
FIG. 7 is a sectional view of the finished electric circuit.

To manufacture an electric circuit in accordance with the invention, the following is the preferred way of setting about it:

In a first step (see FIG. 1), a sheet 1 of a nickel and chrome alloy is bonded by means of a resin 2 to an insulating support 3 (for example an epoxy resin, polyamide, polytetrafluoroethylene reinforced with glass fibers) of a thickness between 0.1 and 1 mm and bonded to the rear face of a copper layer 4 of a thickness between 10 and 70 microns.

In a second step (see FIG. 2), a mask 5 comprising annular opening 5a is applied to the resistive sheet 1 opposite the zones of the sheet 1 which are to be etched. This mask 5 is obtained by applying a photosensitive lacquer to sheet 1. After drying the lacquer, it is subjected to the action of light through a photographic negative reproducing the circuit to be etched. Then the masking lacquer is developed and baked.

In a third step, the whole is subjected to chemical, electrochemical or ionic machining, as described for example in French Pat. Nos. 2,344,940 and 2,354,617 belonging to the applicant, for etching the zones of the resistive sheet 1 situated opposite the annular opening 5a of mask 5.

After removal of mask 5, sheet 1 is in the form shown in FIG. 3.

In a fourth step (see FIG. 4), after the resistive sheet has been cleaned, a fine nickel layer 6a (thickness of the order of 1,000 Å) is applied thereto, then a copper layer 6, obtained by electrolytic deposit, of a thickness equal to about 5 microns. During depositing of layers 6a and 6, the rear face 4a is protected by an anti-acid film 4b.

In a fifth step (see FIG. 5), a hole 7 is pierced in the center through the assembly obtained in the fourth step.

In a sixth step, the hole 7 is metallized after previous conditioning of the parts to be metallized. This conditioning removes practically the whole of layer 6 of FIG. 5.

To this effect (see FIG. 6):

- a fine copper layer (thickness $\leq 5$ microns) is deposited chemically or electrolytically on the whole of the part,
- a protecting mask 9 is deposited in the openings etched in the resistive sheet 1. This mask 9 is obtained as previously described by exposure to light and development,
- in the hole 7 on both faces of the assembly is deposited an electrolytic copper layer 10 if a thickness between 20 and 40 microns, then an electrolytic tin-lead layer 11 of a thickness between 5 and 15 microns,
- the protecting mask 9 is removed,
- the fine copper layer 8 which was protected by mask 9 is removed by chemical etching,
- the external tin-lead layer 11 is removed by chemical or electrochemical stripping.

Figure 8:
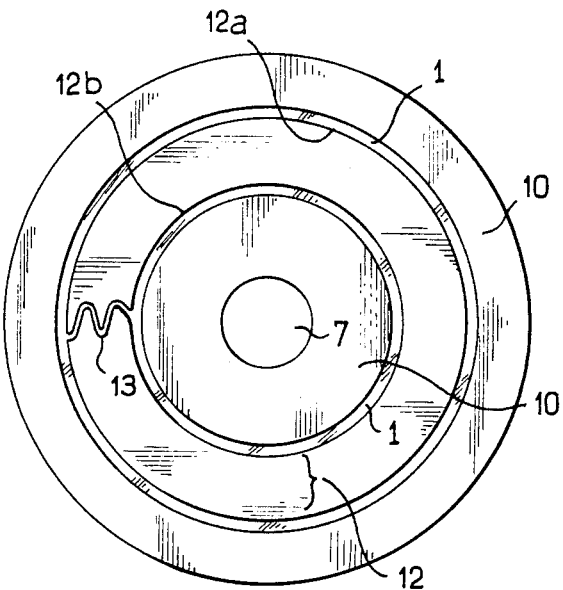
FIG. 8 is a top view of this circuit.

Then the electric circuit shown in FIGS. 7 and 8 is obtained.

It can be seen in FIG. 8 that the electric circuit thus obtained has the form of a disc comprising two concentric conducting zones 12a, 12b etched in the resistive sheet 1, separated by a recess 12 in the form of a split ring. These two concentric zones 12a, 12b are connected together by a thin resistant filament 13 which has been formed from the resistive sheet, whereby mask (5) is formed to reproduce the contour of the desired filament, the filament being formed during the third step of the process.

This resistant filament 13 has advantageously a sinuous profile so as to increase its length and the ohmic value of the whole of the circuit.

The disc shape of the electric circuit of the invention may be stamped out from a sheet reproducing a large number of circuits etched as has just been described.

In all cases, there is obtained, in accordance with the process of the invention, a resistant filament 13 having perfectly defined and reproducible dimensions with very small deviations from its ohmic value during large scale manufacture.

Because of the perfect reproducibility of the dimensions and of the ohmic value of the resistant filament 13 of the circuit, the firing probability P (see FIG. 9) is practically zero below an electric voltage less than the value V2 and this firing probability is identical to unity and in a well defined time Δt for a voltage V greater than $V_2$.

FIG. 9 thus illustrates the perfect reliability of operation of the device of the invention.

Figure 10:
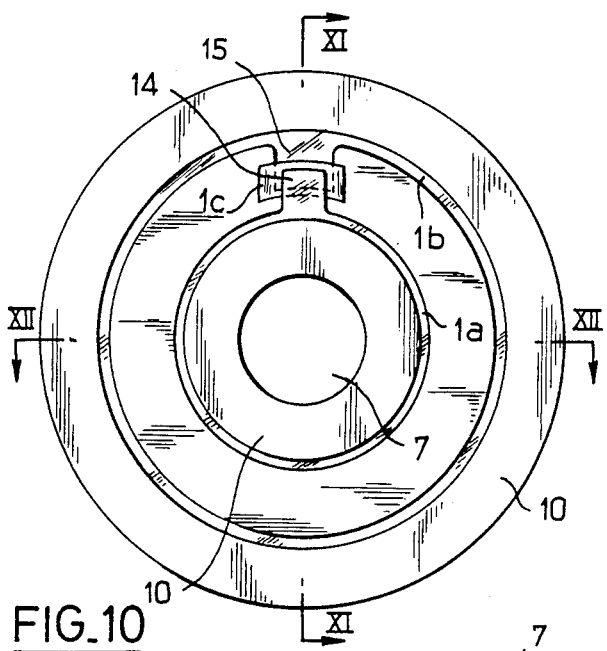
FIG. 10 is a top view of a variant of the circuit in accordance with the invention.
Figure 11:
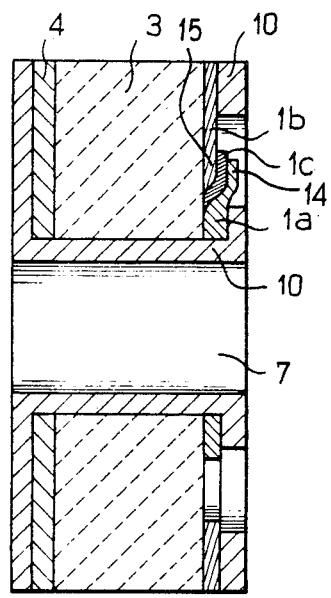
FIG. 11 is a sectional view through plane XI—XI of FIG. 10.
Figure 12:
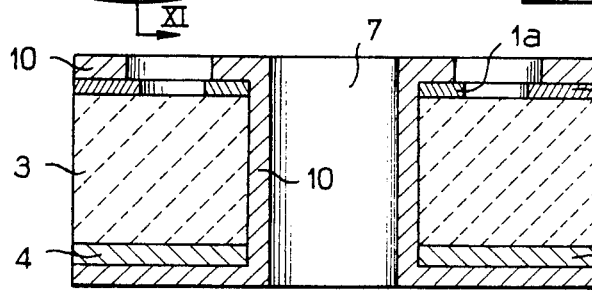
FIG. 12 is a sectional view through plane XII—XII of FIG. 10.

In FIGS. 10, 11 and 12 there is shown another variant of a detonator in accordance with the invention.

In this variant, the resistive sheet comprises two parts 1a, 1b, situated in the extension of each other and between which is inserted a sheet 1c of an amorphous semiconductor material, for example of the Zn Te type (zinc tellurium).

The edge of part 1a of the sheet partially overlaps the sheet 1c of the amorphous semi-conductor material, whereas this latter overlaps partially the other part 1b of the resistive sheet.

In this construction, the conducting layers 1a, 1b are deposited in a vacuum. The amorphous semi-conducting layer 1c is also deposited in a vacuum. It can be seen in FIG. 10 that layer 1a situated near the central hole 7 comprises a radial strip 14 which partially covers the layer 1c of the semi-conductor material, whereas layer 1c covers a radial strip 15 connected to the external conducting layer 1b.

The complementary advantages provided by this construction are the following.

It was explained above in reference to FIG. 9 that, for a supply voltage $V_1$ maintained for a time $t_1$ which may be very long, the firing probability must be zero.

On the other hand, for a supply voltage $V_2$, maintained for a time $t_2$ which may be very brief, the firing probability must be equal to 1.

The use of a purely resistive heating filament, such as filament 13 does not allow, for some applications for example in which $V_1$ must be close to $V_2$ with $t_1$ very long and $t_2$ very brief, the two above-mentioned conditions to be fulfiled simultaneously.

In the construction shown in FIGS. 10 to 12, the heating element is no longer formed solely by a resistive material but is in fact a structure of the metal-insulation type (or amorphous semi-conductor-metal type) having two conducting states, namely a "high impedance" conducting state (stae A on the curve of FIG. 13) and a "low impedance" conducting state (state B).

The operation of such a variant is the following: for applied voltages less than $V_s$, this structure is in its "high impedance" state (A), the current which flows through the circuit is very small, the dissipated power is very small and the firing probability is zero for a voltage V less than $V_s$.

When the applied voltage becomes equal to $V_s$, the device switches very rapidly (a few nanoseconds) to its "low impedance" state (B).

Then, the current flowing through the circuit becomes sufficient for firing the explosive and the firing probability for a voltage V greater than $V_s$ is equal to unity.

Of course, the invention is not limited to the examples which have just been described and numerous modifications may be made thereto without departing from the scope of the invention.

Thus, the disc or washer shape of the circuit is not critical: It may be different provided that it allows easy fitting to the firing device.

We claim:

1. A process for manufacturing an electric circuit comprising an electrically resistant element (13), (14, 1c, 15) for firing a pyrotechnic device, said process comprising the steps of fixing a sheet (1) of an electrically resistant material to an electrically insulating support (3), etching two conducting zones (12a, 12b), (1a, 1b) on said sheet, separating said conducting zones by an electrically resistant element (13), (14, 1c, 15), and covering each of said two conducting zones (12a, 12b), (1a, 1b) at least partially by a layer (10) of a conducting material intended to provide the electric contact with the terminals supplying the electric current to the circuit, this process comprising the following steps:

first applying a fine nickel layer (6a) and then a fine copper layer (6) to the sheet (1), piercing a hole (7) through said sheet (1), support (3), fine nickel layer (6a) and fine copper layer (6), depositing a fine copper layer (8) on the assembly, depositing a protecting mask (9) in the openings etched in the resisting sheet, depositing a copper layer (10) of a thickness between 20 and 40 microns and then a tin-lead layer of a thickness between 5 and 15 microns in the hole (7) and on the two faces of the assembly, removing the protecting mask (9) and removing the fine copper layer (8) protected by the mask (9) by chemical action and, removing the external tin-lead layer (11) by chemical action.

2. The process according to claim 1, further comprising the steps of covering the sheet (1) with a mask (5) in order to etch the sheet (1), said mask (5) being formed by photoetching and reproducing the contour of the conducting zones (12a, 12b) and of the filament (13) to be etched on said sheet, and subjecting the mask (5) and the sheet (1) to the action of an appropriate eroding agent so as to remove the material of the sheet opposite the zones of the sheet not covered by the mask (5).

3. The process according to claim 1, further comprising the step of depositing an element (1c) made from amorphous semi-conducting material between the two conducting zones (1a, 1b) of the sheet by vacuum deposit.

4. The process according to claim 3, further comprising the step of forming the element (1c) of zinc-tellurium.

* * * * *

UNITED STATES PATENT AND TRADEMARK OFFICE
CERTIFICATE OF CORRECTION

PATENT NO. : 4,525,238

DATED : June 25, 1985

INVENTOR(S) : Claude Flassayer et al

It is certified that error appears in the above-identified patent and that said Letters Patent is hereby corrected as shown below:

Column 2, line 34, after the word "of" (first occurrence) insert the word --the--.

Column 2, line 63, delete "electrically" and insert therefor --electricity--.

Column 3, lines 28 and 29, delete "respective" and insert therefor --resistive--.

Column 4, line 26, after "layer" insert --8--.

Column 4, line 34, delete "if" and insert therefor --of--.

Column 5, line 45, delete "stae" and insert therefor --state--.

Signed and Sealed this

Third Day of December 1985

[SEAL]

Attest:

DONALD J. QUIGG

Attesting Officer     Commissioner of Patents and Trademarks